(12) United States Patent
Nah et al.

(10) Patent No.: US 7,148,554 B2
(45) Date of Patent: Dec. 12, 2006

(54) DISCRETE ELECTRONIC COMPONENT ARRANGEMENT INCLUDING ANCHORING, THERMALLY CONDUCTIVE PAD

(75) Inventors: Chih Kai Nah, Singapore (SG); Morris D Stillabower, Tipton, IN (US); Binghua Pan, Singapore (SG); Sim Ying Yong, Singapore (SG); Przemyslaw Gromala, Krakow (PL)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/014,443

(22) Filed: Dec. 16, 2004

(65) Prior Publication Data

US 2006/0131732 A1 Jun. 22, 2006

(51) Int. Cl.
*H05K 7/10* (2006.01)
*H05K 1/18* (2006.01)
*H05K 5/02* (2006.01)
*H01L 23/48* (2006.01)

(52) U.S. Cl. .................. 257/532; 257/E51.003; 257/E27.009; 257/E27.033; 257/774; 257/728; 257/773; 257/E27.016; 257/528; 257/712; 257/713; 257/698; 257/691; 257/700; 257/701; 257/703; 257/796; 257/784; 257/786; 257/676; 257/724; 361/760; 361/763; 361/734; 361/766

(58) Field of Classification Search ........ 257/E51.003, 257/E27.009, E27.016, E27.033, 774, 773, 257/728, 737, 734, 738, 778, 691, 698, 700, 257/701, 772, 784, 786, 796, 532, 528, 712, 257/713, 717
See application file for complete search history.

(56) References Cited

U.S. PATENT DOCUMENTS

| | | | |
|---|---|---|---|
| 4,417,296 A | | 11/1983 | Schelhorn |
| 5,283,717 A | * | 2/1994 | Hundt ................... 361/813 |
| 5,645,707 A | * | 7/1997 | Omoto ................... 205/114 |
| 6,707,680 B1 | * | 3/2004 | Schaper ................... 361/760 |
| 6,836,022 B1 | * | 12/2004 | Boone et al. ............ 257/778 |
| 6,906,259 B1 | * | 6/2005 | Hayashi ................... 174/52.4 |
| 2001/0000927 A1 | * | 5/2001 | Rodenbeck et al. ..... 257/778 |
| 2003/0122254 A1 | * | 7/2003 | Lyne ....................... 257/738 |
| 2004/0022038 A1 | * | 2/2004 | Fingueroa et al. ....... 361/763 |
| 2004/0065462 A1 | * | 4/2004 | Hayashi ................... 174/52.1 |
| 2004/0150097 A1 | * | 8/2004 | Gaynes et al. ........... 257/704 |
| 2004/0160299 A1 | * | 8/2004 | Marcoux et al. ......... 336/200 |
| 2004/0198012 A1 | * | 10/2004 | Viswanathan et al. ... 438/321 |
| 2004/0217455 A1 | * | 11/2004 | Shiono et al. ............ 257/678 |
| 2004/0218336 A1 | | 11/2004 | Speigl |
| 2005/0035845 A1 | * | 2/2005 | Zhou et al. ............... 338/322 |
| 2005/0133929 A1 | * | 6/2005 | Howard ................... 257/774 |

FOREIGN PATENT DOCUMENTS

JP 2000-200701 * 7/2000

OTHER PUBLICATIONS

European Search Report dated Mar. 20, 2006.

* cited by examiner

*Primary Examiner*—Alexander Oscar Williams
(74) *Attorney, Agent, or Firm*—Stefan V. Chmielewski

(57) ABSTRACT

An electronic component arrangement includes a discrete electronic component having first and second terminals and a centre-exposed pad. A substrate has a first electrical conductor electrically connected to the first terminal, a second electrical conductor electrically connected to the second terminal, and a third electrical conductor. A thermally conductive element is in direct thermal communication with both the centre-exposed pad of the electronic component and the third electrical conductor of the substrate.

20 Claims, 1 Drawing Sheet

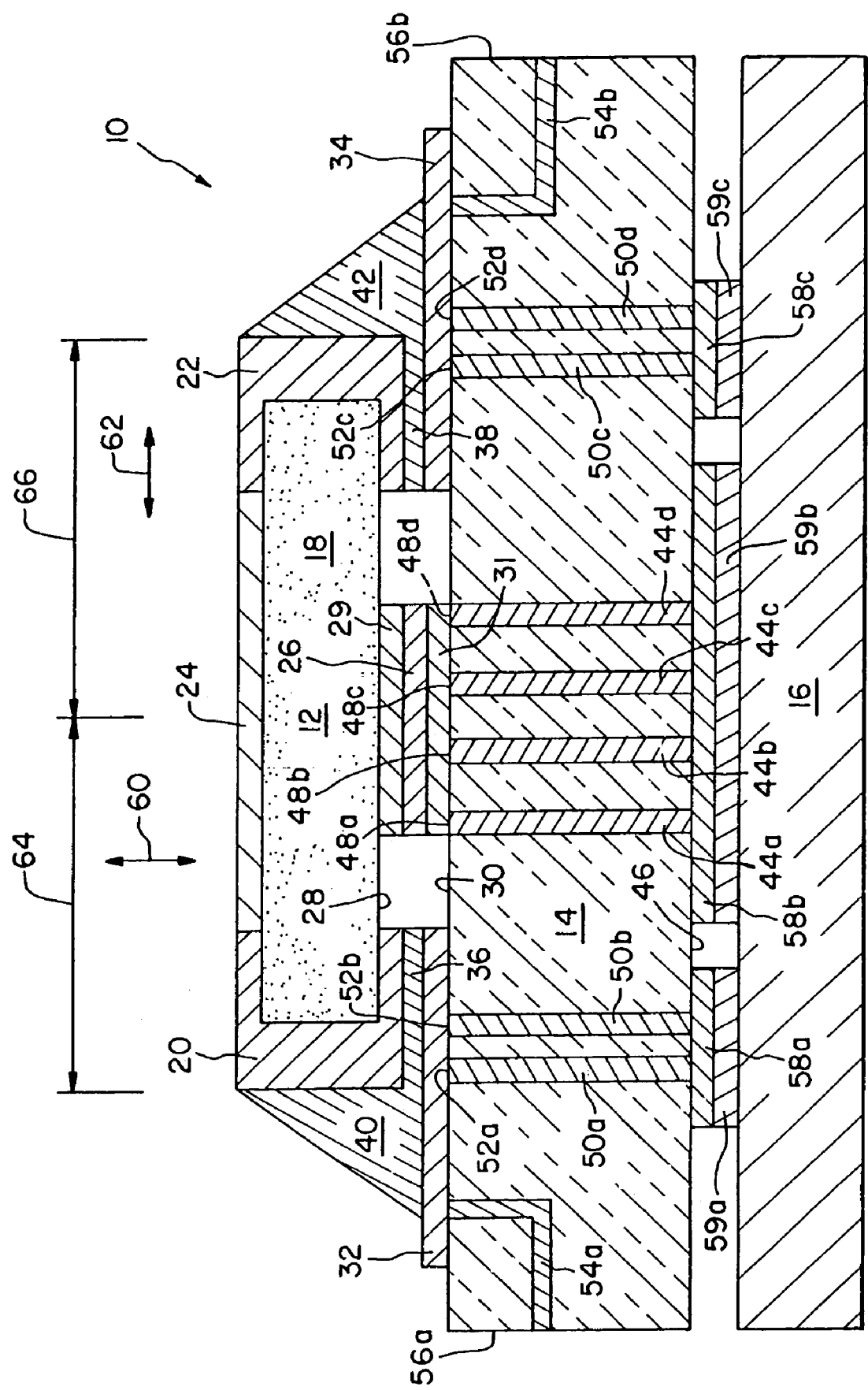

DISCRETE ELECTRONIC COMPONENT ARRANGEMENT INCLUDING ANCHORING, THERMALLY CONDUCTIVE PAD

BACKGROUND OF THE INVENTION

Discrete electronic components in the form of surface mounted devices and passive chip components are widely used in the electronics industry. Such components may be formed of ceramic, for example. In many applications, the components carry a large power load in relation to the components' size. The high power density requirements may result in premature failure of the components due to heat stress and thermal expansion. For example, repeated thermal expansion may cause cracking in the solder joints at the terminals of the components, as well as oxidation and intergranular corrosion.

A typical power rating of a ceramic resistor chip, such as a model 2512 chip, is less than or equal to one watt per chip from room temperature up to 70° C. However, above 70° C. the power rating steadily falls to 0 watt at about 155° C. Temperature cycling testing reveals that such chips cannot pass a test including 1000 cycles between −40° C. aid 150° C. Many automotive applications require a high power chip to operate at an application temperature range of 85° C. to 105° C., which the chips are not able to reliably withstand.

One known solution to the chip overheating problem is to use multiple chip components connected together in series or parallel. However, this adds to the component cost and negates the advantage of surface mounted devices, which is in occupying as little space as possible.

What is needed in the art is a method of decreasing the heat stress on discrete electronic components used in high power applications.

SUMMARY OF THE INVENTION

The present invention provides a discrete electronic component arrangement including a thermally conductive element for carrying heat from the body of the component to the substrate on which the component is mounted. The thermally conductive element may anchor the body of the component to the substrate to thereby reduce the stress of thermal expansion on the component and its solder joints.

In one form, the present invention comprises an electronic component arrangement including a discrete electronic component having a body and first and second terminals. A substrate has a first electrical conductor electrically connected to the first terminal, and a second electrical conductor electrically connected to the second terminal. A thermally conductive element is in direct thermal communication with both the body of the electronic component and the substrate.

In another form, the present invention comprises an electronic component arrangement including a discrete electronic component having a body and first and second terminals. A substrate includes a first side and a second side. A first electrical conductor is disposed on the first side and is electrically connected to the first terminal. A second electrical conductor is disposed on the first side and is electrically connected to the second terminal. A first thermal via extends between the first side and the second side. A thermally conductive element is in thermal communication with both the body of the electronic component and the thermal via on the first side of the substrate.

An advantage of the present invention is that heat is carried away from the body of the electronic component, thereby reducing both the temperature of the component and its thermal expansion. Thus, the solder joints at the terminals of the component are subject to less fatigue.

Another advantage is that the thermally conductive element anchors the body of the electronic component to the substrate, thus limiting the amount of component thermal expansion that the solder joints must withstand and be subjected to.

Yet another advantage is that the thermally conductive element provides structural support to the electronic component and spaces the electronic component a certain distance away from the substrate. Thus, the thickness of the layers of solder between the terminals of the electronic component and the solder pads supported by the substrate may be greater, which may result in the solder joints having an increased life.

BRIEF DESCRIPTION OF THE DRAWING

The above-mentioned and other features and objects of this invention, and the manner of attaining them, will become more apparent and the invention itself will be better understood by reference to the following description of embodiments of the invention taken in conjunction with the accompanying drawing, which is a schematic, cross-sectional view of one embodiment of an electronic component arrangement of the present invention.

Although the drawing represents and embodiment of the present invention, the drawing is not necessarily to scale and certain features may be exaggerated in order to better illustrate and explain the present invention. The exemplifications set out herein illustrate embodiments of the invention in several forms and such exemplification is not to construed as limiting the scope of the invention in any manner.

DESCRIPTION OF INVENTION

The embodiments discussed below are not intended to be exhaustive or limit the invention to the precise forms disclosed in the following detailed description. Rather, the embodiments are chosen and described so that others skilled in the art may utilize their teachings.

One embodiment of an electronic component arrangement 10 of the present invention is shown in the drawing. Arrangement 10 includes a discrete electronic component in the form of a printed ink chip resistor 12 mounted on a substrate in the form of a printed circuit board (PCB) 14. A heat sink 16 absorbs and dissipates heat from PCB 14.

Chip 12 includes a body 18, a first terminal 20, a second terminal 22 and a centre-exposed pad 29. Body 18 may be formed of a ceramic material, for example, while terminals 20, 22 and pad 29 may be formed of an electrically conductive metal. In the embodiment shown, chip 12 is in the form of a printed ink resistor or polymer thick film (PTF) resistor having a layer of ink 24 deposited on an outer surface of body 18 and electrically connected to both terminal 20 and terminal 22. However, chip 12 may also be in the form of another type of electronic component, such as a capacitor or a diode.

A thermally conductive element 26 may be positioned as shown such that element 26 is in direct thermal communication with both pad 29 of chip 12 and pad 31 of PCB 14. Pads 29, 31 may be electrically conductive solder pads. Thus element 26 may anchor chip 12 to PCB 14. Element 26 may be in the form of solder or any thermal conductive adhesive material.

PCB 14 includes a first electrical conductor in the form of a first solder pad 32, and a second electrical conductor in the form of a second solder pad 34. A first layer of solder 36 electrically interconnects first solder pad 32 and first terminal 20. Similarly, a second layer of solder 38 electrically interconnects second solder pad 34 and second terminal 22. An additional, first wedge-shaped portion of solder 40 may improve the electrical and mechanical connections between first terminal 20 and first solder pad 32. Similarly, an additional, second wedge-shaped portion of solder 42 may improve the electrical and mechanical connections between second terminal 22 and second solder pad 34.

PCB 14 also includes a plurality of first thermal vias 44a–d extending between first side 30 and a second side 46 of PCB 14. Vias 44 may be plated vias such as, for example, tin vias with solder plating. Vias 44 may be in thermal communication with thermally conductive element 26. For example, exposed surfaces 48a–d of vias 44a–d may be in thermal communication with element 26 through pad 31.

PCB 14 further includes a plurality of second thermal vias 50a–d extending between first side 30 and a second side 46 of PCB 14. Like vias 44, vias 50 may be plated vias such as tin vias with solder plating. Vias 50a–b may be in thermal communication with first solder pad 32, and vias 50c–d may be in thermal communication with second solder pad 34. For example, exposed surfaces 52a–b of vias 50a–b may be in thermal communication with first solder pad 32 through solder and/or thermally conductive adhesive. Similarly, exposed surfaces 52c–d of vias 50c–d may be in thermal communication with second solder pad 34 through solder and/or thermally conductive adhesive.

Electrically conductive traces 54a–b may be in electrical communication with first solder pad 32 and second solder pad 34, respectively. Traces 54a–b may extend to outer edges 56a, 56b, respectively, of PCB 14 to thereby provide external electrical access to first and second solder pads 32, 34. Although traces 54a–b are shown as being directly connected to pads 32, 34, it is also possible for traces 54a–b to be connected to pads 32, 34 through thermal vias 50.

Thermal conductors in the form of thermally conducting solder pads 58a–c and corresponding layers 59a–c of thermally conductive, electrically non-conductive adhesive may thermally interconnect vias 44, 50 and heat sink 16. More particularly, solder pad 58a and layer 59a may thermally interconnect vias 50a, 50b and heat sink 16; solder pad 58b and layer 59b may thermally interconnect vias 44a–d and heat sink 16; and solder pad 58c and layer 59c may thermally interconnect vias 50c, 50d and heat sink 16. Layers 59a, 59c in particular may be formed of a non-electrically conducting material so as to avoid heat sink 16 being electrically shorted to terminals 20, 22.

Layers 59a–c are shown as having a continuous thickness that may prevent electrical shorting between pads 58a–c and heat sink 16. However, in one embodiment, layers 59-c are formed of a soft material that may allow pads 58a–c to physically contact heat sink 16 when PCB 14 and heat sink 16 are pressed together. Thus, pads 58a–c may be formed of copper and covered with electrically non-conductive solder mask to prevent shorting between pads 58a–c and heat sink 16. Alternatively, pads 58a, 58c may be formed of thermally conducting, electrically non-conducting pads, such as those sold by The Bergquist Company of Chanhassen, Minn. Pad 58b and/or layer 59b may also be formed of an electrically non-conducting material. However, because vias 44 may not be electrically connected to any current-carrying portion of chip 12, it may not be necessary for pad 58b or layer 59b to be formed of an electrically non-conducting material.

During manufacture, chip 12 may be attached to PCB 14 via solder 36, 38, 40, 42 and thermally conductive element 26. The structural support provided by pads 29, 31 and thermally conductive element 26 between chip 12 and PCB 14 may advantageously enable first layer of solder 36 and second layer of solder 38 to be formed with a greater thickness in the directions indicated by double arrow 60. This greater thickness may provide the solder joints, including wedges 40, 42, with greater durability and resistance to cracking.

In operation, a voltage may be applied across the combination of trace 54a and trace 54b to thereby cause current to flow through traces 54a, 54b, solder pads 32, 34, solder 36, 38, 40, 42, and chip 12. The current may cause the temperature of body 18 and terminals 20, 22 of chip 12 to increase. That is, chip 12 may produce heat. The thermally conductive nature of element 26 enables element 26 to carry heat away from body 18 to PCB 14. The heat-carrying effectiveness of element 26 may be enhanced by pads 29, 31 being in direct thermal engagement with body 12 and PCB 14, respectively.

Vias 44a–d may carry the heat from pads 29, 31 and element 26 to pad 58b and layer 59b by virtue of the thermally conductive nature of vias 44a–d. Similarly, the thermally conductive nature of vias 50a–d may enable vias 50a, 50b to carry heat from solder pad 32 to pad 58a and layer 59a, and enable vias 50c, 50d to carry heat from solder pad 34 to pad 58c and layer 59c. Further, the thermally conductive nature of pads 58a–c and layers 59a–c may enable pads 58a–c and layers 59a–c to carry heat from vias 44a–d, 50a–d to heat sink 16. Thus, thermally conductive element 26, vias 44, 50, pads 58 and layers 59 provide thermally conductive pathways for carrying heat from chip 12 and thereby lowering the temperature of chip 12. A lower operating temperature may extend the operating life of chip 12 and reduce degradation of the solder joints, e.g., cracking, at terminals 20, 22.

By anchoring body 18 of chip 12 to PCB 14, element 26 may also reduce the stress of repeated cycles of thermal expansion on the solder joints. With known electronic component arrangements, the expansion of the chip in the longitudinal directions indicated by double arrow 62 results in stress on the solder joints. If one of the two solder joints is weaker than the other, the weaker solder joint will tend to be moved or flexed more than the stronger solder joint. The moving and flexing further weakens the weaker solder joint, and the weaker joint may eventually be moved or flexed substantially the entire distance of thermal expansion of chip 12. This may result in the weaker solder joint failing early in its life. In the present invention, in contrast, the center portion of body 18 may be anchored in place relative to PCB 14. Thus, each of the solder joints may be moved or flexed by only the distance of the thermal expansion of the associated longitudinal half of chip 12. That is, each solder joint may be subjected to only that portion of the chip's thermal expansion that is between the mid-point of chip 12 and the corresponding one of terminals 20, 22. More particularly, the solder joint formed by layer 36 and wedge 40 may be moved or flexed by the thermal expansion of only an associated section 64 of body 18. Similarly, the solder joint formed by layer 38 and wedge 42 may be moved or flexed by the thermal expansion of only an associated section 66 of body 18.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. An electronic component arrangement, comprising:
   a discrete electronic component having first and second terminals and a non-current-carrying centre-exposed pad;
   a substrate having a first electrical conductor electrically connected to said first terminal, a second electrical conductor electrically connected to said second terminal, and a thermally and electrically conductive element; and
   a thermally conductive anchoring element in direct thermal communication with both said non-current-carrying centre-exposed pad of said electronic component and said thermally and electrically conductive element of said substrate, said anchoring element anchoring said electronic component to said substrate.

2. The arrangement of claim 1, wherein said thermally conductive anchoring element is configured to carry heat from said electronic component to said substrate.

3. The arrangement of claim 1, wherein said electronic component comprises a passive electronic component.

4. The arrangement of claim 1, wherein said electronic component comprises a surface mounted device.

5. The arrangement of claim 1, wherein said electronic component comprises a ceramic electronic component.

6. The arrangement of claim 1, wherein said electronic component comprises one of a resistor, capacitor and diode.

7. The arrangement of claim 1, wherein said substrate comprises a printed circuit board.

8. An electronic component arrangement, comprising:
   a discrete electronic component having an electrically non-conductive body and first and second terminals;
   a substrate including:
      a first side;
      a second side;
      a first electrical conductor disposed on said first side and electrically connected to said first terminal;
      a second electrical conductor disposed on said first side and electrically connected to said second terminal; and
      a first thermal via extending between said first side and said second side; and
   a thermally conductive anchoring element in thermal communication with both said body of said electronic component and said thermal via on said first side of said substrate, said anchoring element anchoring said electronic component to said substrate.

9. The arrangement of claim 8, further comprising a heat sink in thermal communication with said thermal via on said second side of said substrate.

10. The arrangement of claim 9, further comprising a first thermal conductor thermally interconnecting said thermal via and said heat sink.

11. The arrangement of claim 8, wherein said thermally conductive element is attached to both said body of said electronic component and said first side of said substrate to thereby anchor said electronic component to said substrate.

12. The arrangement of claim 11, wherein said thermally conductive element is attached to both a centre-exposed pad of said body of said electronic component and a solder pad on said first side of said substrate.

13. The arrangement of claim 8, wherein said substrate includes a second thermal via extending between said first side and said second side of said substrate, said second thermal via being in thermal communication with one of said first electrical conductor and said second electrical conductor.

14. The arrangement of claim 13, further comprising a heat sink in thermal communication with said second thermal via on said second side of said substrate.

15. The arrangement of claim 14, further comprising:
   a first thermal conductor thermally interconnecting said first thermal via and said heat sink; and
   a second thermal conductor thermally interconnecting said second thermal via and said heat sink, said second thermal conductor being substantially electrically non-conductive.

16. The arrangement of claim 8, wherein said first electrical conductor comprises a first solder pad, said second electrical conductor comprising a second solder pad, said arrangement further comprising first and second layers of solder, said first layer of solder electrically interconnecting said first solder pad and said first terminal, said second layer of solder electrically interconnecting said second solder pad and said second terminal.

17. The arrangement of claim 16, wherein said thermally conductive anchoring element comprises a means for increasing a thickness of said first and second layers of solder.

18. An electronic component arrangement, comprising:
   a discrete electronic component having an electrically non-conductive body, first and second terminals, and an electrically conductive element interconnecting said first and second terminals;
   a substrate including:
      a first side;
      a second side;
      a first electrical conductor disposed on said first side and electrically connected to said first terminal;
      a second electrical conductor disposed on said first side and electrically connected to said second terminal; and
      a thermal via extending between said first side and said second side;
   a thermally conductive anchoring element in thermal communication with both said body of said electronic component and said thermal via on said first side of said substrate, said anchoring element being attached to both said body of said electronic component and said substrate; and
   a heat sink thermally connected to said thermal via on said second side of said substrate.

19. The arrangement of claim 18, wherein said thermally conductive anchoring element is attached to a center portion of said body of said electronic component.

20. The arrangement of claim 18, wherein said thermal via of said substrate is non-current carrying.

* * * * *